United States Patent
Doyle et al.

(10) Patent No.: US 10,832,847 B2
(45) Date of Patent: Nov. 10, 2020

(54) LOW STRAY FIELD MAGNETIC MEMORY

(71) Applicant: Intel Corporation, Santa Clara, CA (US)

(72) Inventors: Brian S. Doyle, Portland, OR (US);
Kaan Oguz, Beaverton, OR (US);
Kevin P. O'Brien, Portland, OR (US);
David L. Kencke, Beaverton, OR (US);
Charles C. Kuo, Hillsboro, OR (US);
Mark L. Doczy, Portland, OR (US);
Satyarth Suri, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 287 days.

(21) Appl. No.: 15/735,622

(22) PCT Filed: Jun. 26, 2015

(86) PCT No.: PCT/US2015/038012
§ 371 (c)(1),
(2) Date: Jan. 8, 2018

(87) PCT Pub. No.: WO2016/209267
PCT Pub. Date: Dec. 29, 2016

(65) Prior Publication Data
US 2020/0051724 A1 Feb. 13, 2020

(51) Int. Cl.
*H01L 43/02* (2006.01)
*H01L 43/08* (2006.01)
(Continued)

(52) U.S. Cl.
CPC ..... *H01F 10/1936* (2013.01); *H01F 10/3272* (2013.01); *H01L 43/02* (2013.01); *H01L 43/08* (2013.01); *H01L 43/10* (2013.01)

(58) Field of Classification Search
CPC .......... H01L 43/02; H01L 43/08; H01L 43/10
See application file for complete search history.

(56) References Cited

U.S. PATENT DOCUMENTS

| 2005/0073778 A1* | 4/2005 | Hasegawa | ............. B82Y 10/00 |
| | | | 360/324.1 |
| 2005/0266274 A1* | 12/2005 | Hasegawa | ............. G11B 5/372 |
| | | | 428/828 |

(Continued)

FOREIGN PATENT DOCUMENTS

| JP | 2015032713 A | 2/2015 |
| WO | 2015016061 | 2/2015 |

OTHER PUBLICATIONS

Taiwanese Patent Office, Office Action dated Oct. 9, 2019 in Taiwanese Patent Application No. 105115994, 8 pages.

(Continued)

*Primary Examiner* — Fazli Erdem
(74) *Attorney, Agent, or Firm* — Trop, Pruner & Hu, P.C.

(57) ABSTRACT

An embodiment includes an apparatus comprising: a substrate; a magnetic tunnel junction (MTJ), on the substrate, comprising a fixed layer, a free layer, and a dielectric layer between the fixed and free layers; and a first synthetic anti-ferromagnetic (SAF) layer, a second SAF layer, and an intermediate layer, which includes a non-magnetic metal, between the first and second SAF layers; wherein the first SAF layer includes a Heusler alloy. Other embodiments are described herein.

25 Claims, 7 Drawing Sheets

(51) Int. Cl.
  *H01L 43/10* (2006.01)
  *H01F 10/193* (2006.01)
  *H01F 10/32* (2006.01)

(56) References Cited

U.S. PATENT DOCUMENTS

| | | |
|---|---|---|
| 2007/0086121 A1 | 4/2007 | Nagase et al. |
| 2008/0007994 A1 | 1/2008 | Guo |
| 2008/0088980 A1 | 4/2008 | Kitagawa et al. |
| 2008/0094886 A1 | 4/2008 | Ranjan et al. |
| 2008/0225585 A1 | 9/2008 | Ranjan et al. |
| 2011/0031569 A1 | 2/2011 | Watts et al. |
| 2011/0062537 A1 | 3/2011 | Oh et al. |
| 2011/0069535 A1 | 3/2011 | Clinton et al. |
| 2011/0303997 A1 | 12/2011 | Wang et al. |
| 2012/0032288 A1 | 2/2012 | Tomioka |
| 2013/0134534 A1 | 5/2013 | Sbiaa et al. |
| 2013/0240963 A1 | 9/2013 | Beach et al. |
| 2014/0056061 A1 | 2/2014 | Khvalkovskiy et al. |
| 2014/0070341 A1 | 3/2014 | Beach et al. |
| 2015/0008547 A1 | 1/2015 | Pi et al. |
| 2015/0091110 A1 | 4/2015 | Kuo et al. |
| 2015/0129996 A1 | 5/2015 | Tang et al. |
| 2015/0162378 A1* | 6/2015 | Carey .................. H01L 43/02 257/421 |
| 2015/0171316 A1* | 6/2015 | Park .................... H01L 43/10 257/421 |
| 2016/0148975 A1* | 5/2016 | Kato .................... H01L 43/08 257/427 |

OTHER PUBLICATIONS

Kurt, et al., "Cubic Mn2Ga Thin Films: Crossing the Spin Gap with Ruthenium", Physical Review Letters, Jan. 15, 2014, five pages, vol. 112, Issue 2, American Physical Society.

Thiyagarajah, et al., "Giant spontaneous Hall effect in zero-moment Mn2RuxGa", Applied Physics Letters, Mar. 24, 2015, four pages, vol. 106, Issue 12, AIP Publishing LLC.

European Patent Office, Communication pursuant to Rule 164(1) EPC dated Jan. 31, 2019 in European Patent Application No. 15896553.3, 14 pages.

The International Searching Authority, "Written Opinion of the International Searching Authority and the International Search Report" dated Mar. 25, 2016 in International Application No. PCT/US2015/038012.

Wang et al., "Impact of Stray Field on the Switching Properties of Perpendicular MTJ for Scaled MRAM," 2012, pp. 29.2.1 to 29.2.4 Institute of Electrical and Electronics Engineers.

International Application No. PCT/US2015/038035, filed Jun. 26, 2015 and entitled "Perpendicular Magnetic Memory with Symmetric Fixed Layers" by Charles C. Kuo, et al.

IBA et al, "Top-pinned Perpendicular MTJ Structure with a Counter Bias Magnetic Field Layer for Suppressing a Stray-Field in Highly Scalable STT.MRAM," 2013, pp. T136-T137, Symposium on VLSI Technology Digest of Technical Papers.

International Application No. PCT/US2015/036266, filed Jun. 17, 2015 and entitled "Random Number Generator" by Charles C. Kuo, et al.

European Patent Office, Extended European Search Report dated May 2, 2019 in European Patent Application No. 15896553.3.

* cited by examiner

LOW STRAY FIELD MAGNETIC MEMORY

TECHNICAL FIELD

Embodiments of the invention are in the field of semiconductor devices and, in particular, magnetic memory.

BACKGROUND

As described in U.S. Patent Application Publication 2015/0091110, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque (STT). If a current is passed through a magnetization layer, called the fixed magnetic layer, the current output from the magnetization layer will be spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (which is a function of damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory (STTM) has the advantages of lower power consumption and better scalability over conventional magnetic random access memory (MRAM) which uses magnetic fields to flip the active elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements:

DETAILED DESCRIPTION

Figure 1A:
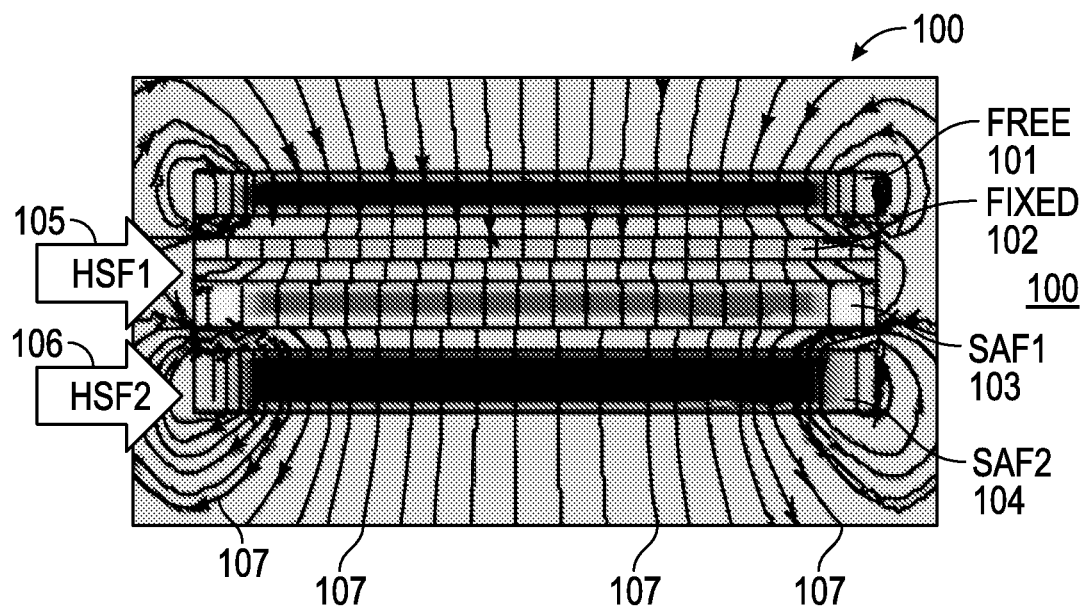
FIGS. 1A-D depict unbalanced magnetic fringe or stray fields.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As described above, STTM has low power consumption and good scalability over conventional MRAM. However, STTMs can suffer from poor stability when aggressively scaled. Stability is one of the most important issues facing scaling of STTM based devices and memory arrays fabricated there from. As scaling continues, the need for smaller memory elements to fit into a scaled cell size has driven the industry in the direction of perpendicular STTMs, which have higher stability for small memory element sizes.

Common perpendicular STTMs are achieved with a material layer stack that includes a bottom electrode, a fixed magnetic layer, a dielectric layer (e.g., MgO), a free magnetic layer (e.g., CoFeB), a capping layer (e.g., Ta), and a top electrode. A magnetic tunnel junction (MTJ) portion of the material layer stack includes the fixed magnetic layer, the dielectric layer, and the free magnetic layer. A perpendicular STTM uses a perpendicular MTJ (pMTJ) as a memory element. This material stack is a basic material stack for fabricating STTM, and may be fabricated with greater complexity. For example, an anti-ferromagnetic layer may also be included between the bottom electrode and fixed magnetic layer. Additionally, electrodes may themselves include multiple layers of material with differing properties. The material stack may, in its most basic form, be an in-plane system, where spins of the magnetic layers are in a same plane as the layers themselves.

Regarding pMTJs more specifically, with layer or interface engineering the material stack may be fabricated to provide a perpendicular spin system. In an example, a free magnetic layer (e.g., a free magnetic layer composed of CoFeB) is thinned down from a conventional thickness used for in-plane STTM devices. The extent of thinning may be sufficient such that a perpendicular component obtained from the iron/cobalt (Fe/Co) in the free magnetic layer interacting with oxygen in the dielectric layer (e.g., interacting with a magnesium oxide (MgO) layer) dominates over the in-plane component of the free CoFeB layer. This example provides a perpendicular system based on a single layer system of coupling to one interface of the free layer (i.e., the CoFeB—MgO interface). The degree of oxidation of surface iron/cobalt atoms (Fe/Co) in the CoFeB layer by oxygen from the MgO layer provides the strength (stability) of the free layer to have perpendicular-dominated spin states. Thickness of the fixed magnetic layer also determines magnetization direction in the same manner as in the thickness of a free magnetic layer. Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

The above described conventional stack fails to provide high stability. Stability is defined as the energy barrier between two magnetic states (e.g., (1, 0), (parallel, anti-parallel)). Stability is equal to the product of effective magnetic anisotropy ($K_{eff}$), thickness of free magnetic layer, and area of free magnetic layer. Applicant determined scalability of a pMTJ is a problem below 30 nm critical dimension (CD). For example, the thermal stability of the free layer drops significantly as junction diameter decreases (i.e., with scaling). A desired thermal stability or industry standard, such as 60 kT, may be required for commercial viability of any pMTJ memory device.

The lack of stability is often due to fringing magnetic fields (sometimes referred to as "stray" fields) that result from the magnetic nature of the individual layers of the STTM stack, which can have three or more magnetic layers, each with their own fringing field, as can be seen in FIGS. 1A-D. FIG. 1A shows stack 100, which includes free layer 101, on a tunneling barrier (not clearly shown), fixed layer 102, first synthetic anti-ferromagnet layer (SAF1) 103, second SAF (SAF2) 104, and fringing fields 107. SAFs are artificial antiferromagnets consisting of two or more thin ferromagnetic layers separated by a nonmagnetic layer. Since the magnets 103, 104 have magnetic moments that point in opposite directions, it is possible to globally balance these fringing fields (such as the field HSF1 105 and field HSF2 106) by increasing or decreasing the magnetic strength (thickness) of either of layers 103, 104. Fringing fields 107 coming from layers 102, 103 would normally point in a direction opposite to the fields 107 of layer 104. However, as shown in FIG. 1A the cumulative or net moment is unbalanced in this particular situation and therefore all net fringe/stray fields 107 are pointing in one direction (thereby creating an $H_{offset}$ for free layer 101).

Figure 1B:
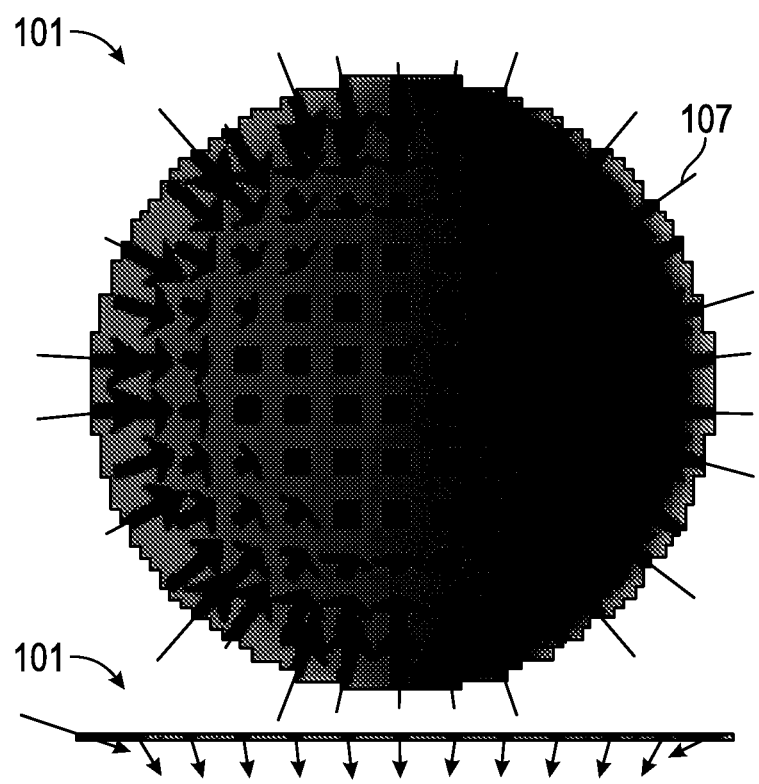
Figure 1C:
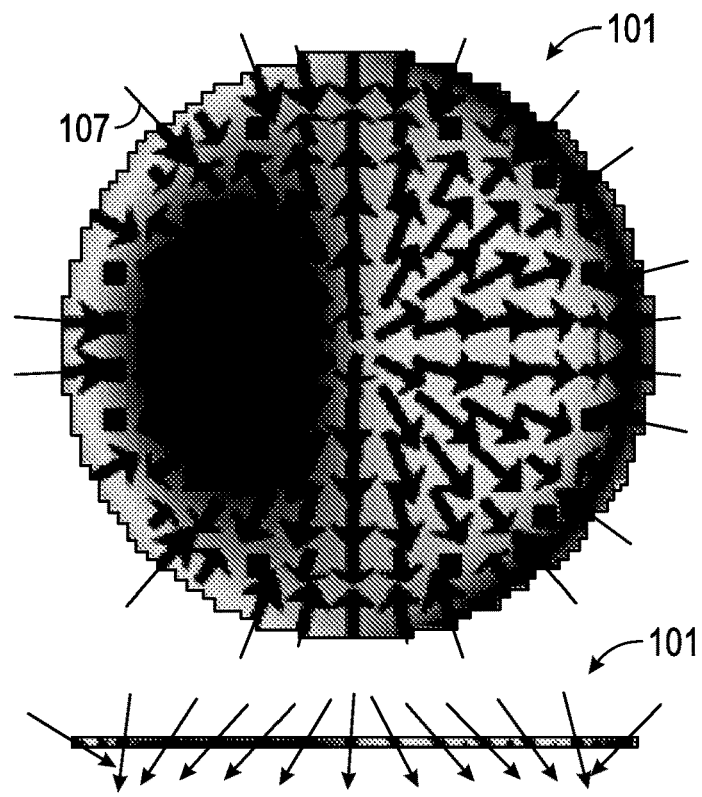
Figure 1D:
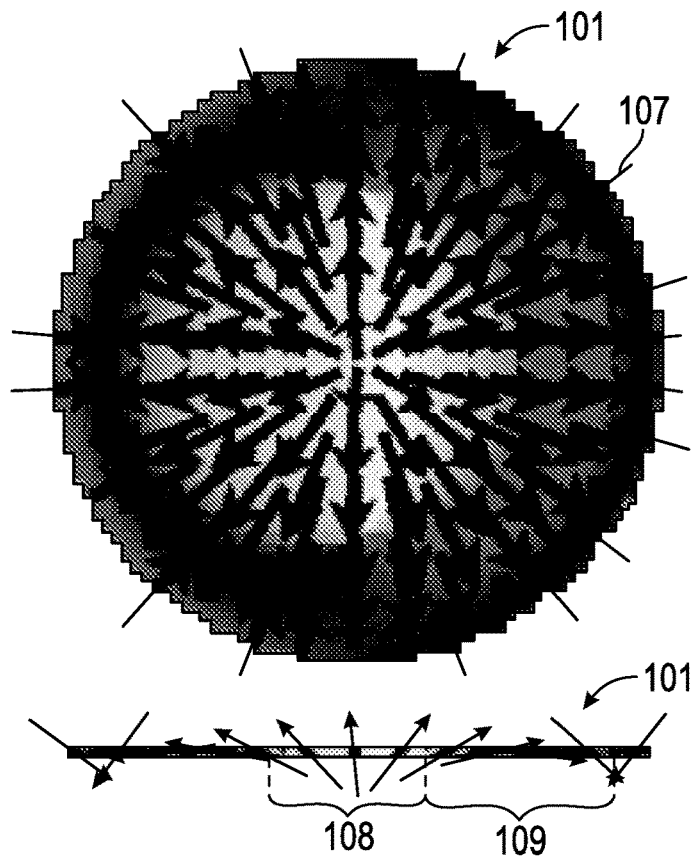

FIGS. 1B-1D illustrates fringing fields 107 on free layer 101. The circles and the arrows of fields 107 show the direction of the fringing field on the free layer 101 (with top image of each of FIGS. 1B-1D showing fields 107 on layer 101 from a top view with the bottom image of each of FIGS. 1B-1D showing fields 107 on layer 101 from a cross-section view). FIG. 1B has no SAF layers and only a single fixed layer (e.g., layer 102 without layers 103, 104 of FIG. 1A). FIG. 1B is very unbalanced as seen with the vast majority of fields 107 pointing down across the surface of layer 101. FIG. 1C includes two SAF layers in addition to the fixed layer (similar to FIG. 1A). However, the SAF fields (HSF1 and HSF2) are balanced so the resultant fields 107 on layer 101 are still very unbalanced. FIG. 1C includes two SAF layers in addition to the fixed layer (similar to FIG. 1A). However, HSF2 is 1.5×HSF1 resulting in greater balance of fields 107 upon layer 101. With FIG. 1D, the "global effect" on layer 101 may be balanced but there are still "hotspots" that lack balance, such as areas 108 and 109. In other words, even though FIG. 1D is more balanced globally than FIGS. 1B and 1C, in FIG. 1D there is still significant variation of the magnetic vector going along the width of free layer 101 (even though the net sum of the magnetic vectors (arrows) across layer 101 adds up to zero). This means that different parts of magnetic free layer are less or more stable. These variations can be regarded as weak spots that can cause the device to reduce its non-volatility. Thus, the solution to the problem of fringing fields is to change the magnetic strength of the individual layers (as seen in FIG. 1D), until the fringing fields are globally balanced out. However, this results in local variations of the fringing field that the free layer sees (as also seen in FIG. 2D).

The lack of balance of the fringing fields may result in favorable switching in one direction and unfavorable switching in the other. This is called "$H_{offset}$" and is addressed in FIGS. 2A-D. $H_{offset}$ has major implications on the stability and critical switching current of an STTM. For the state which is less stable, this reduces the non-volatility of the cell. For the state that is more stable, the critical current, which increases with increasing stability, now becomes more difficult to switch during a write event.

Figure 2A:
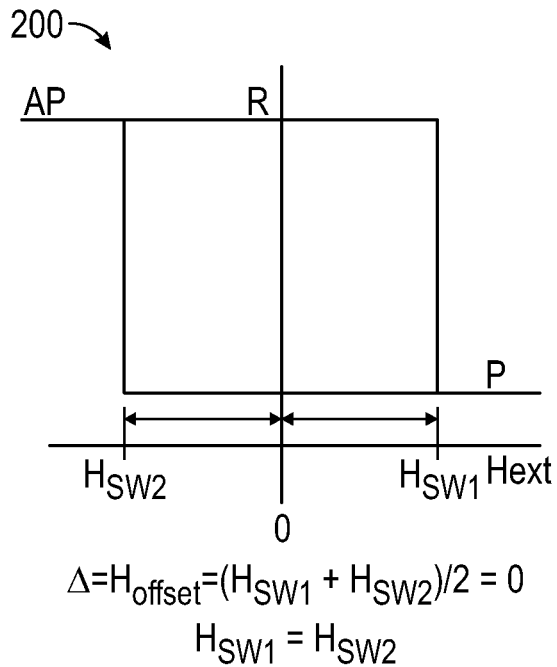
FIGS. 2A-D include depict various levels of $H_{offset}$.
Figure 2B:
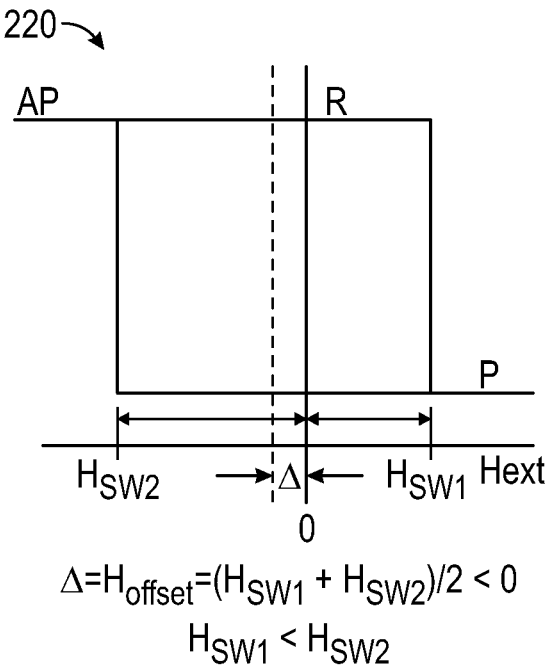
Figure 2C:
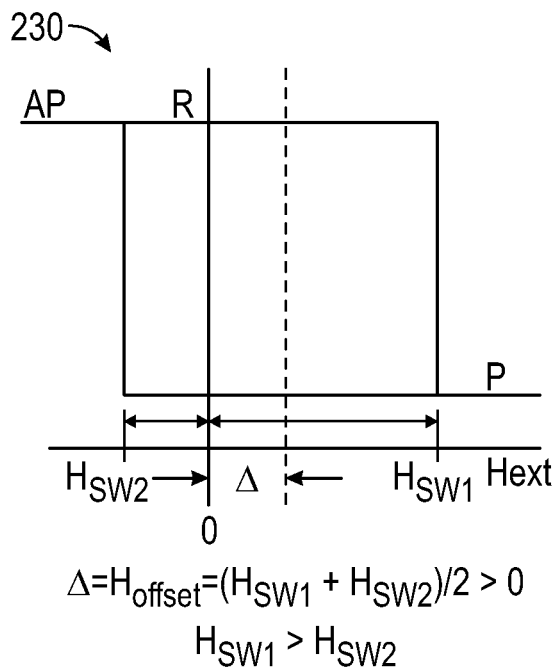
Figure 2D:
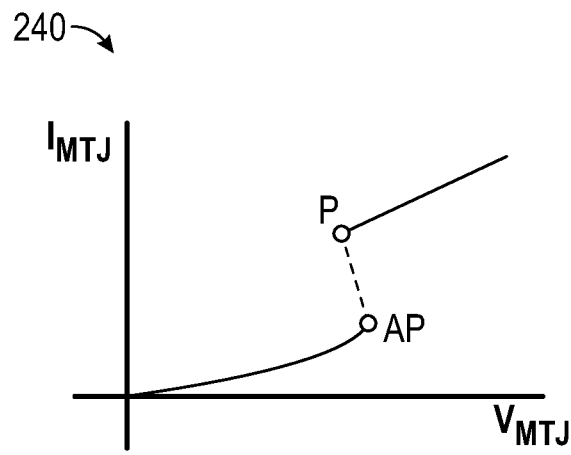

FIGS. 2A-D address $H_{offset}$. Specifically, FIGS. 2A-C illustrate magnetic hysteresis plots 200, 220, and 230 showing zero and non-zero $H_{offset}$. FIG. 2A illustrates hysteresis plot 200 showing a fixed magnet with zero magnetic offset ($H_{offset}$) Here, x axis depicts a magnetic field ($N_{ext}$) that passes through a pMTJ, and the y axis depicts resistance across the pMTJ. High resistance occurs when the fixed magnet layer and free magnet layer of a pMTJ have anti-parallel (AP) magnetization orientations with regard to each other, while low resistance occurs when the fixed magnet layer and free magnet layer of a pMTJ have parallel (P) magnetization orientations with regard to one another. Switching states between AP and P orientations occurs at two separate magnetic switching fields—$H_{SW1}$ and $H_{SW2}$, where $H_{SW1}$ is a positive magnetic switching field and $H_{SW2}$ is a negative magnetic switching field. $H_{offset}$ can be expressed as:

$$\Delta = H_{offset} = (H_{SW1} + H_{SW2})/2$$

$H_{offset}$ shown in hysteresis plot 200 is zero because the magnitudes of $H_{SW1}$ and $H_{SW2}$ are equal relative to the zero point. Embodiments described herein provide low to no $H_{offset}$ but other embodiments may provide $H_{offset}$ configured to be non-zero as described with reference to FIGS. 2B-C. FIG. 2B illustrates hysteresis plot 220 showing a fixed magnet with negative $H_{offset}$. The $H_{offset}$ shown in hysteresis plot 220 is negative because the magnitude of $H_{SW2}$ is larger than the magnitude of $H_{SW1}$ relative to the zero point. The difference in the switching magnetic fields is A. FIG. 2C illustrates plot 230 showing a fixed magnet with positive $H_{offset}$. The $H_{offset}$ shown in hysteresis plot 230 is positive because the magnitude of $H_{SW1}$ is larger than the magnitude of $H_{SW2}$ relative to the zero point. The difference in the switching magnetic fields is A.

Thus, one or more embodiments are directed to increasing stability (e.g., thermal stability or the ability to maintain a memory state at expected operating temperatures) for the free layer and reducing $H_{offset}$ for the pMTJ based device. Such a device includes, for example, a perpendicular STTM system. Applications may include use of pMTJs in embedded memory, embedded non-volatile memory (NVM), magnetic random access memory (MRAM), NVM, and non-embedded or stand-alone memories.

Figure 3A:
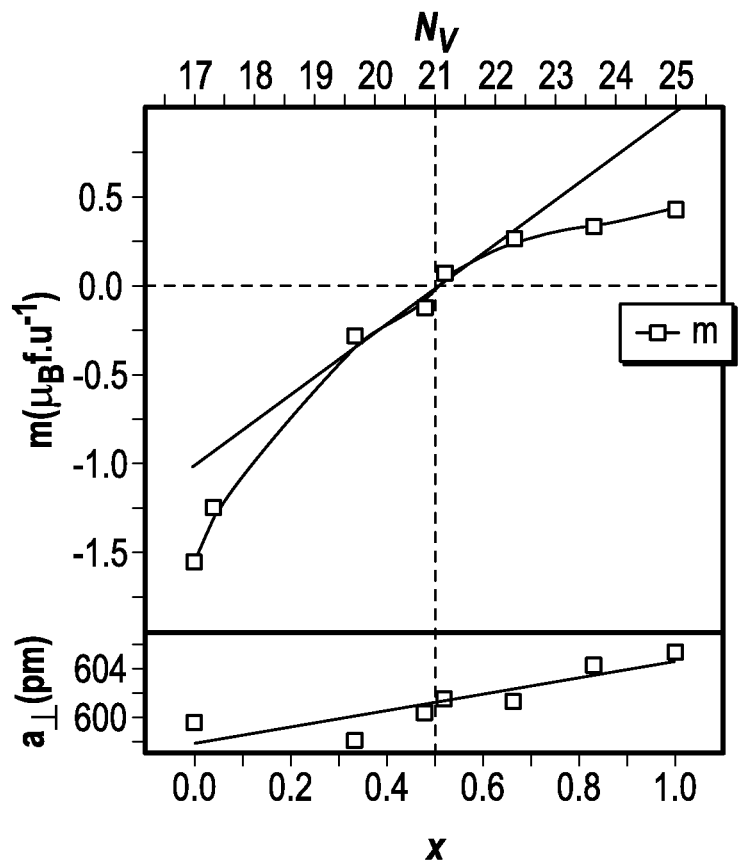
FIGS. 3A-B depict magnetic moment management using Ruthenium (Ru) in an embodiment of the invention.
Figure 3B:
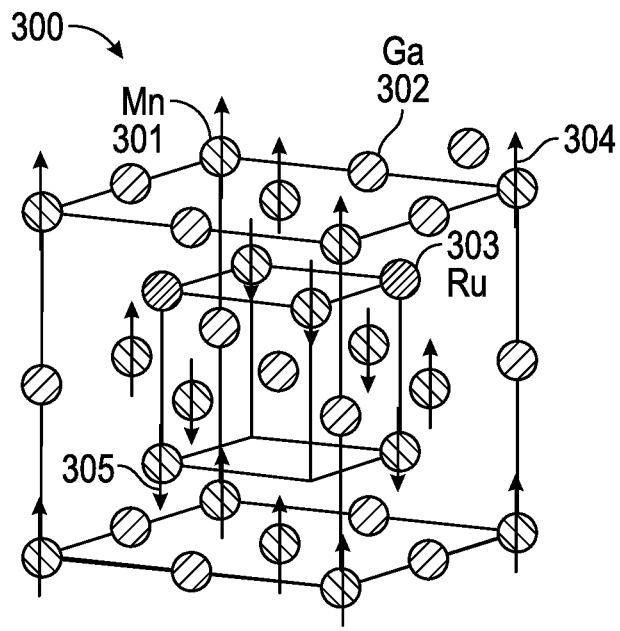

Specifically, an embodiment increases stability for a pMTJ by addressing magnetization offset (Hoffset) issues on both a local scale (to reduce hotspots of unbalanced magnetic vectors) and a global scale for the free layer of a pMTJ. This has the effect of minimizing Hoffset as pMTJ area decreases (i.e., with aggressive scaling). To accomplish this, rather than varying the thickness (or the number of layers) in the SAF, an embodiment reduces the magnetic field strength of the SAF by using a class of Heusler materials whose magnetic moment changes (magnetic moment is directly related to fringing field) according to the amount of ruthenium (Ru) added to the Manganese-Gallium lattice. As seen in FIG. 3B, a lattice 300 comprising Mn 301 and Ga 302 is altered in an embodiment to include Ru 303. The addition of Ru causes the appearance of two sublattices, each pointed in opposite directions. For example, one sublattice includes an upward facing magnetic vector 304 which is countered by another sublattice with a downward facing magnetic vector 305 If sufficient Ru 303 is added up to 0.5, one sublattice is stronger. Above 0.5, the other sublattice is stronger, and the magnetic moment changes direction. At around 0.5, such as $Mn_xRu_{1-x}Ga$ where X=0.5, the two sub-lattices balance each other out in terms of magnetic vector, and the net magnetic moment (and hence the fringing fields from this material) are reduced to zero or near zero. This is shown in FIG. 3A where Ru content is on the X axis and net magnetic moment is on the Y axis.

Figure 4A:
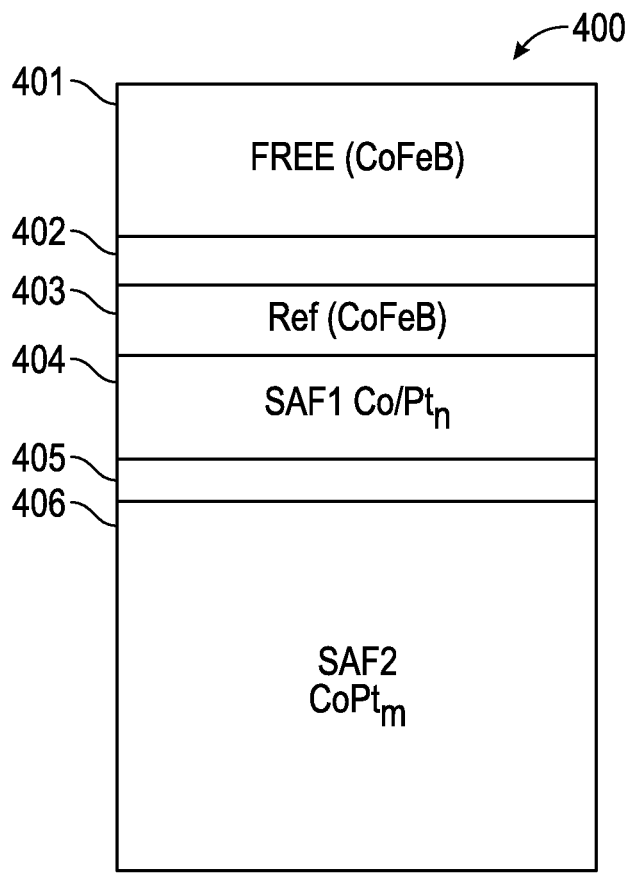
FIGS. 4A-D depict magnetic moment management using Ru in an embodiment of the invention.
Figure 4B:
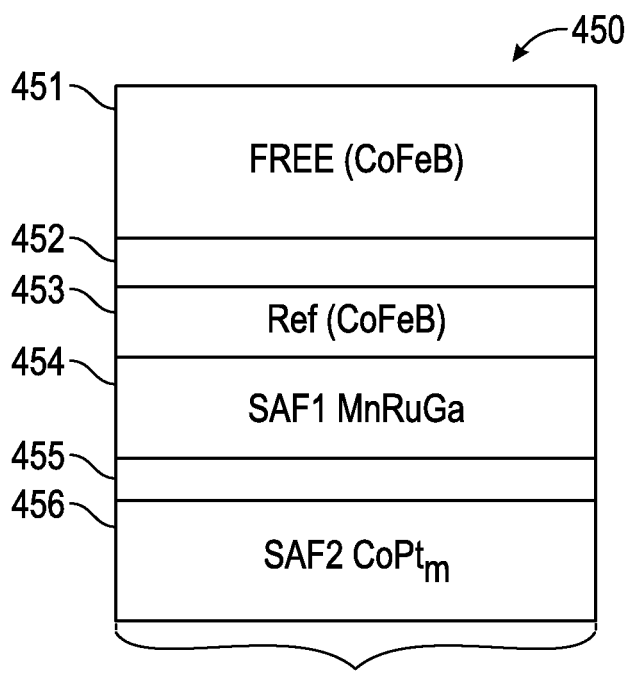
Figure 4C:
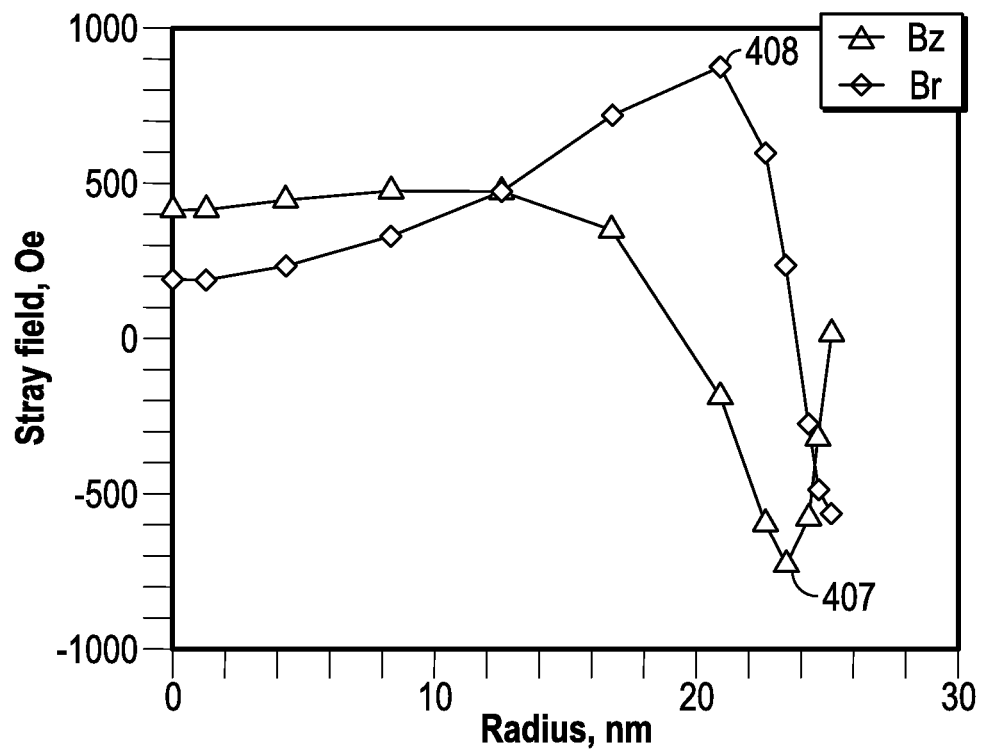
Figure 4D:
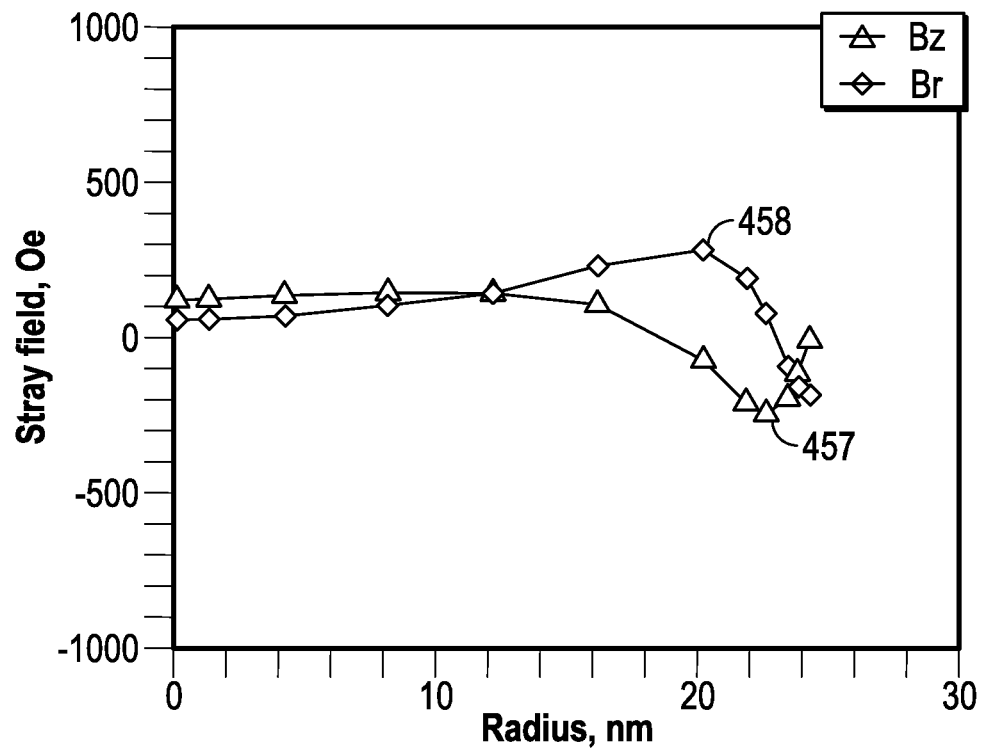

FIG. 4C shows the results of simulations of the conventional MTJ stack 400 of FIG. 4A. FIG. 4D shows the results of simulations of the low magnetic moment MTJ stack 450 embodiment of FIG. 4B. Specifically, FIG. 4A shows free layer 401 (e.g., CoFeB) on dielectric 402 (e.g., MgO). Reference layer (also called pinned or fixed layer) 403 (e.g., CoFeB) is on SAF1 404. SAF1 includes conventional SAF materials such as alternating layers of Co/Pt. A convention layer 405, including Ru, is between SAF1 404 and SAF2 406. Layer 406 may also include Co/Pt. Stack 400 results in the high stray fields for both vertical stray field (407) and the radial stray field (408) seen by the free layer resulting from the fixed layer of each stack acting on the free layer, from the center of the device (0) to the edge (25 nm) of the device. The fields are strong (e.g., >500 Oe) and uneven with increased strength along the perimeter (near 25 nm from center of free layer).

In contrast, FIG. 4B shows a stack 450 with free layer 451 (e.g., CoFeB) on dielectric 452 (e.g., MgO). Reference layer 453 (e.g., CoFeB) is on SAF1 454. Layer 455 includes Ru and is between SAF1 454 and SAF2 456. As seen in FIG. 4D, stack 450 results in lowered stray fields for both vertical stray field (457) and the radial stray field (458) seen by the free layer resulting from the fixed layer of each stack acting on the free layer, from the center of the device (0) to the edge (25 nm) of the device. The fields are much lower and more even moving towards the perimeter (near 25 nm) of the free layer. It can be seen that stack 450 with the low moment Mn, Ru, Ga, (MRG) component reduces the stray field by a factor of more than three over the conventional stack 400.

Various embodiments disclosed herein have addressed pMTJs. However, any of these pMTJs may be substituted for with a MTJ in alternative embodiments. Any pMTJ/MTJ described herein may be used in a memory cell by coupling one portion or node of the pMTJ/MTJ stack (e.g., top electrode 101 of FIG. 1) to a bit-line and another node of the pMTJ/MTJ stack (e.g., bottom electrode 111 of FIG. 1) to a source or drain node of a switching device, such as a selection transistor. The other of the source and drain node of the selection transistor may be coupled to a source line of the memory cell. The gate of the selection transistor may couple to a word-line. Such a memory cell may utilize TMR of the pMTJ/MTJ to store memory states. Embodiments provided herein provide an increase in stability for the memory states. Such embodiments subsequently provide more stable and power efficient memory cells that can be scaled below, for example, 22 nm CD. The STT memory cell may couple to a sense amplifier. A plurality of the STT memory bit cells may be operably connected to one another to form a memory array, wherein the memory array can be incorporated into a non-volatile memory device. It is to be understood that the selection transistor may be connected to the top electrode or the bottom electrode of a pMTJ/MTJ stack.

Figure 5:
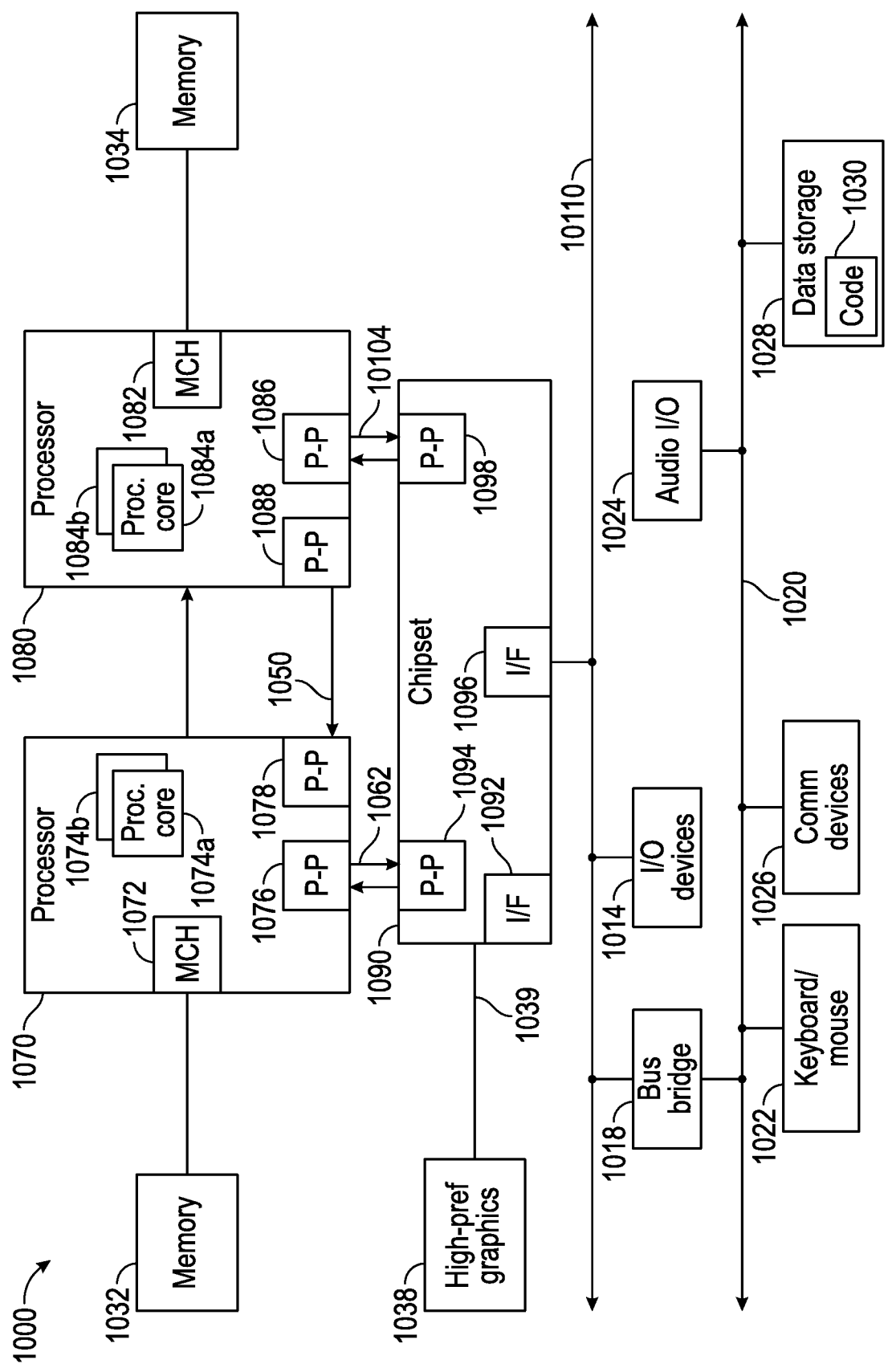
FIG. 5 includes a system comprising a memory cell within which an embodiment of the invention is included.

FIG. 5 includes a system that may include the above described memory cell. FIG. 5 includes a block diagram of a system 1000 in accordance with an embodiment of the present invention. System 1000 may include hundreds or thousands of the above described memory cells that may be critical to memory functions in system 1000. System 1000 may include, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer battery life, longer memory state storage in a broader range of operating temperatures) to such computing nodes.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code.

Each processing element 1070, 1080 may include at least one shared cache or memory unit which may include pMTJs/MTJs described herein. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array (which may include MTJs/pMTJs described herein). For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include pMTJs/MTJs described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 5 may alternatively be partitioned using more or fewer integrated chips than shown in the FIG. 5. For example, a field programmable gate array may share a single wafer with a processor element and memory including pMTJs/MTJs described herein.

As used herein, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the TMR effect while applying voltage to the output electrodes. In an embodiment, the role of the dielectric layer (e.g., dielectric layers 105, 107) is to cause a large magneto-resistance ratio. The magneto-resistance is the ratio of the difference between resistances when the two ferromagnetic layers have AP magnetizations and the resistance of the state with the parallel magnetizations.

MTJs described herein, such as pMTJs, function essentially as a resistor, where the resistance of an electrical path through the MTJ may exist in two resistive states, either "high" or "low," depending on the direction or orientation of magnetization in the free magnetic layer(s) (embodiments may have one or more free layers) and in the fixed magnetic layers. In the case that the spin direction is down (minority) in the free magnetic layer, a high resistive state exists, wherein direction of magnetization in the coupled free magnetic layer(s) and the dominant (i.e., most stable) fixed magnetic layer are substantially opposed or AP with one another. In the case that the spin direction is up (majority) in the coupled free magnetic layer(s), a low resistive state exists, wherein the direction of magnetization in the coupled free magnetic layer(s) and the dominant fixed magnetic layer (e.g., thickest Pt layer or more number Pt layers) is substantially aligned or P with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through STT using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layers. The electrons of the spin polarized current from the fixed magnetic layers tunnel through the tunneling barrier or dielectric layers and transfers its spin angular momentum to the free magnetic layer, wherein the free magnetic layer will orient its magnetic direction from AP to that of the dominant fixed magnetic layer or P. The free magnetic layer may be returned to its original orientation by reversing the current.

Thus, the pMTJ may store a single bit of information ("0" or "1") by its state of magnetization. The information stored in the MTJ is sensed by driving a current through the pMTJ. The free magnetic layer(s) does not require power to retain its magnetic orientations. As such, the state of the MTJ is preserved when power to the device is removed. Therefore, a STT memory bit cell composed of stack 100, is, in an embodiment, non-volatile.

Various embodiments addressed herein include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: a substrate; a magnetic tunnel junction (MTJ), on the substrate, comprising a fixed layer, a free layer, and a dielectric layer between the fixed and free layers; and a first synthetic anti-ferromagnetic (SAF) layer, a second SAF layer, and an intermediate layer, which includes Ruthenium (Ru), between the first and second SAF layers; wherein the first SAF layer includes Manganese (Mn), Gallium (Ga), and Ru.

The free, fixed, and SAF layers may include sublayers. As used in the examples, stating a "layer" is in a stack does not necessarily indicate the layer does or does not include sublayers. For example, the fixed layer and/or second SAF layer may each include first sublayers comprising Co alternating with second sublayers comprising Platinum (Pt). Further, not every layer is included in every example. For example, Example 1 may also include a coupling or barrier layer to, for example, couple a SAF layer including Mn, Ga, and Ru to the fixed layer. Also, other embodiments may include additional fixed and/or free layers. Certainly MTJ stacks that include the subject matter of Example 1 may also include electrode layers on either side of the MTJ despite the Figures included herein failing to illustrate any such electrode (considering those of ordinary skill in the art would appreciate such electrodes would be provided for the MTJ). Furthermore, the MTJ may instead be a pMTJ in another version of Example 1 or other examples provided herein.

FIG. 4B may be considered to have a "composite" fixed layer comprising layers 453, 454, 455, 456.

Another version of Example 1 includes an apparatus comprising: a substrate; a magnetic tunnel junction (MTJ), on the substrate, a free layer, and a dielectric layer; and a first synthetic anti-ferromagnetic (SAF) layer, a second SAF layer, and an intermediate layer, which includes Ruthenium (Ru), between the first and second SAF layers; wherein the first SAF layer includes Manganese (Mn), Gallium (Ga), and Ru.

Thus, an embodiment replaces a fixed layer, such as layer 453 of FIG. 4B, with the first and second SAF layers filling the role of the fixed layer for the MTJ.

In example 2 the subject matter of Example 1 can optionally include wherein the first SAF layer is between the intermediate layer and the fixed layer.

This is shown in FIG. 4B.

In example 3 the subject matter of Examples 1-2 can optionally include wherein the second SAF layer does not include Ru.

In example 4 the subject matter of Examples 1-3 can optionally include wherein the second SAF layer is between the intermediate layer and the fixed layer.

In example 5 the subject matter of Examples 1-4 can optionally include wherein each of the first and second SAF layers includes Ru.

Thus, as shown in Examples 3-5 the embodiment of FIG. 4B is not the only embodiment and instead other embodiments may place the Mn, Ru, and Ga in the second SAF layer instead of or in addition to the first SAF layer. Furthermore, if only one SAF layer includes Ru that layer may be between the other SAF layer and the substrate or between the other SAF layer and the MTJ.

More than two SAF layers are possible in some embodiments.

In example 6 the subject matter of Examples 1-5 can optionally include wherein each of the free and fixed layers includes Cobalt (Co), Iron (Fe), and Boron (B) and the dielectric layer includes Magnesium (Mg) and Oxygen (O).

By stating a layer or sublayer includes a metal such as X, Y, Z, this also includes alloys of these metals, and nitrided or oxidized versions of these metals.

In example 7 the subject matter of Examples 1-6 can optionally include wherein at least one of the first and second SAF layers directly contacts the fixed layer.

For example, FIG. 4B shows the first SAF layer directly contacting the fixed layer 453 but other embodiments may provide a coupling or barrier layer between layers 453 and 454. Various embodiments where the first SAF layer does not include Mn may contact the fixed layer directly. However, in other embodiments where the first SAF does include Mn a barrier layer including, for example, Ta, W, and/or Co/Fe, may be between the first SAF layer and the fixed layer to block migration of Mn during an anneal and the like.

In example 8 the subject matter of Examples 1-7 can optionally include wherein the second SAF layer includes Cobalt (Co) and Platinum (Pt) but not Ru.

For example, see FIG. 4B.

In example 9 the subject matter of Examples 1-8 can optionally include wherein the fixed layer includes Mn, Ga, and Ru.

The inclusion of Mn, Ru, and Ga (MRG) may be instead of or in addition to other materials in fixed layer, such as CoFeB.

In example 10 the subject matter of Examples 1-9 can optionally include wherein the first SAF layer includes $Mn_xRu_{1-x}Ga$ where X=0.5.

In example 11 the subject matter of Examples 1-10 can optionally include wherein the first SAF layer includes $Mn_xRu_{1-x}Ga$ where X is between 0.3 and 0.7.

In real world conditions X may be substantially 0.5 which includes a range between 0.3 and 0.7 (which can be shown with elemental analysis).

In example 12 the subject matter of Examples 1-11 can optionally include wherein the first SAF layer includes a first sublattice having a first magnetic vector and a second sublattice having a second magnetic vector that is anti-parallel (AP) to the first magnetic vector.

For example, magnetic vector 305 is AP to vector 304.

In example 13 the subject matter of Examples 1-12 can optionally include wherein the first magnetic vector is of equal strength to the second magnetic vector.

In other words, not only are magnetic vectors (sometimes also referred to as moments) AP to each other (i.e., the directions of the magnetic vectors point away from each other) the magnitude component of the vectors are equal. As used herein, a "magnetic moment" of a magnet is a quantity that determines the torque it will experience in an external magnetic field. The magnetic moment may be considered to be a vector having a magnitude and direction. The magnetic field produced by the magnet is proportional to its magnetic moment.

In example 14 the subject matter of Examples 1-13 can optionally include wherein the first SAF layer and the fixed layer combine to provide a first magnetic vector and the second SAF layer provides a second magnetic vector that is anti-parallel (AP) to the first magnetic vector.

For example, in FIG. 4B layers 453 and 454 combine magnetic moments to counteract the magnetic moment of layer 456, thereby creating zero or close to zero cumulative moment on free layer 451.

In example 15 the subject matter of Examples 1-14 can optionally include wherein the first magnetic vector has a first magnitude and the second magnetic vector has a second magnitude substantially equal to the first magnitude.

In example 16 the subject matter of Examples 1-15 can optionally include wherein the first SAF layer provides substantially zero magnetic moment.

For example, the embodiment of FIG. 3B shows two sublattices that combine to provide zero or close to zero magnetic moment in general, and specifically upon any free layer included in the same stack as crystal 300.

In example 17 the subject matter of Examples 1-16 can optionally include wherein the first SAF layer includes a first thickness, the second SAF layer includes a second thickness substantially equal to the first thickness, and thickness is measured orthogonally to a principle plane in which the substrate lies.

In example 18 the subject matter of the Examples 1-17 can optionally include wherein the first SAF layer includes a first total number of sublayers and the second SAF layer includes a second total number of sublayers equal to the first total number of sublayers.

In another version of example 18 the subject matter of the Examples 1-17 can optionally include wherein the first SAF layer includes a first thickness and a first amount of Ru, the second SAF layer includes a second thickness substantially equal to the first thickness and a second amount of Ru that is greater than the first amount of Ru, and thickness is measured orthogonally to a principle plane in which the substrate lies.

Regarding Examples 17 and 18, "thickness" would be measured along an axis running between the free and SAF2 layers of FIG. 4B. Thus, as noted above, whereas conventional methods may include changing the number of layers or the thickness of layers in one of the SAF layers, an embodiment instead relies on varying the material compositions between the SAF layers. For example, SAF1 layer may include Ru while SAF2 layer may not. Or, SAF1 layer may include $Mn_xRu_{1-x}Ga$ where X is 0.4 and SAF2 layer may include $Mn_xRu_{1-x}Ga$ where X is 0.3. An embodiment provides that the moment of SAF2 substantially balances out the moment from SAF1 and the reference layer. In which case, SAF2 would have to be greater than Ru=0.5 (e.g., X=0.3 where $Mn_xRu_{1-x}Ga$) and further from the 0.5 condition than SAF1 and in the opposite direction (because the top layer comprises SAF1 and the Reference layer).

In example 19 the subject matter of the Examples 1-18 can optionally include wherein the free layer includes a maximum width parallel to a plane in which the substrate lies and more than 50% of the maximum width includes substantially zero magnetic fringing fields collectively from the fixed layer and the first and second SAF layers.

For example, the embodiment of FIG. 4B has a free layer with maximum width 459. More than 50% of this width may have zero magnetic fringing fields. This is contrary to, for example, free layer 101 of FIG. 1D which has hot spots 108 and 109 (i.e., concentrated areas of magnetic fringing fields) so that there is little to any portion of layer 101 that has zero fringing fields/stray fields. Instead, layer 101 can only push towards a collective or global zero fringing field as summed across the entire width of layer 101. In contrast, embodiments described herein may have entire portions (such as 50, 60, 70, or 80% of width 459 of layer 451) that have zero or close to zero magnetic fringing fields, thereby eliminating or greatly reducing magnetic fringing field hotspots.

In another version of Example 19, the subject matter of Examples 1-18 can optionally include wherein the free layer includes a maximum width parallel to a plane in which the substrate lies and more than 50% of the maximum width includes magnetic fringing fields of less than 250 Oe collectively from the fixed layer and the first and second SAF layers.

However, in other embodiment the value may be less than 150, 200, or 300 Oe. This may be coupled with a maximum thickness of the first and second SAF layers and intervening Ru layer of 30 nm (e.g., the thickness of layers 454, 455, 456 may be between 3 to 30 nm, and Ru layer 455 would be between 0.2 nm to 2 nm. Thus, despite the thinness of this portion of the stack the free layer includes a maximum width and more than 50% of the maximum width includes magnetic fringing fields of less than 250 Oe collectively from the fixed layer and the first and second SAF layers.

In another version of Example 19, the subject matter of Examples 1-18 can optionally include wherein the free layer includes a maximum width parallel to a plane in which the substrate lies and more than 50% of the maximum width includes magnetic fringing fields of less than 150 Oe collectively from the fixed layer and the first and second SAF layers.

In example 20 the subject matter of the Examples 18-19 can optionally include a system comprising: a processor; a memory, coupled to the processor, including an apparatus according to any one of examples 1 to 19; and a communication module, coupled to the processor, to communicate with a computing node external to the system.

A communications module may include, for example, element 1026 of FIG. 5, a wireless radio interface, antennae, OFDM module, and the like.

Another version of example 20 may include a mobile computing node including a non-volatile memory that comprises the MTJ. Such a node may include Smartphone or wearable device included in the Internet of Things.

In example 21 the subject matter of the Examples 1-17 can optionally include a field programmable gate array (FPAG) including the MTJ.

Example 22 includes an apparatus comprising: a substrate; a magnetic tunnel junction (MTJ), on the substrate, comprising a fixed layer, a free layer, and a dielectric layer between the fixed and free layers; and a first synthetic anti-ferromagnetic (SAF) layer, a second SAF layer, and an intermediate layer, which includes a non-magnetic metal, between the first and second SAF layers; wherein the first SAF layer includes a Heusler alloy.

Thus, not all embodiments require MRG. The Heusler alloy may include any of various Heusler alloys. The alloy may include Mn and some other element besides Ga and/or Ru. Embodiments include any of a plethora of Heusler alloys, which tend to have low moments such as, without limitation: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$. In these alloys still other embodiments may substitute Ru for Mn such that as Ru increases the Mn portion of the alloy decreases.

In example 23 the subject matter of Example 22 can optionally include wherein the Heusler alloy includes Manganese (Mn) and Ruthenium (Ru).

In example 24 the subject matter of Examples 22-23 can optionally include wherein the non-magnetic metal include Ru.

In example 25 the subject matter of Examples 22-24 can optionally include wherein the first SAF layer is between the intermediate layer and the fixed layer.

In example 26 an embodiment includes no SAF layer or layers. For example, one embodiment includes a free layer, on a dielectric, on a reference layer. The reference layer may include CoFeB. The reference layer may be on a spacer or barrier layer including W, Ta, and the like. The spacer or barrier layer may be a layer including $Mn_xRu_{1-x}Ga$ where x=0.3 to 0.7. Thus, no second SAF layer is provided because the Ru content of the single $Mn_xRu_{1-x}Ga$ layer has enough Ru to provide stability to the fixed layer and zero to very little (<150 Oe) moment on the free layer.

Example 27 includes an apparatus comprising: a substrate; a magnetic tunnel junction (MTJ), on the substrate, comprising a fixed layer, a free layer, and a dielectric layer between the fixed and free layers; and a first synthetic anti-ferromagnetic (SAF) layer, a second SAF layer, and an intermediate layer, which includes a non-magnetic metal, between the first and second SAF layers; wherein the first SAF layer includes a magnetic alloy. In an embodiment such a magnetic alloy may include $Co_xZr_{1-x}$ in alternating layers with Pt. In an embodiment such a magnetic alloy may include $Co_xTa_{1-x}$ in alternating layers with Pt.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a substrate;
   a magnetic tunnel junction (MTJ), on the substrate, comprising a fixed layer, a free layer, and a dielectric layer between the fixed and free layers; and
   a first synthetic anti-ferromagnetic (SAF) layer, a second SAF layer, and an intermediate layer, which includes Ruthenium (Ru), between the first and second SAF layers;
   wherein the first SAF layer includes Manganese (Mn), Gallium (Ga), and Ru;
   wherein the first SAF layer includes a first thickness, the second SAF layer includes a second thickness substantially equal to the first thickness, and thickness is measured orthogonally to a principle plane in which the substrate lies.

2. The apparatus of claim 1, wherein the first SAF layer is between the intermediate layer and the fixed layer.

3. The apparatus of claim 2, wherein the second SAF layer does not include Ru.

4. The apparatus of claim 1, wherein the second SAF layer is between the intermediate layer and the fixed layer.

5. The apparatus of claim 2, wherein each of the first and second SAF layers includes Ru.

6. The apparatus of claim 2, wherein each of the free and fixed layers includes Cobalt (Co), Iron (Fe), and Boron (B) and the dielectric layer includes Magnesium (Mg) and Oxygen (O).

7. The apparatus of claim 1, wherein at least one of the first or second SAF layers directly contacts the fixed layer.

8. The apparatus of claim 1, wherein the second SAF layer includes Cobalt (Co) and Platinum (Pt) but not Ru.

9. The apparatus of claim 1, wherein the fixed layer includes Mn, Ga, and Ru.

10. The apparatus of claim 1, wherein the first SAF layer includes $Mn_xRu_{1-x}Ga$ where X=0.5.

11. The apparatus of claim 1, wherein the first SAF layer includes $Mn_xRu_{1-x}Ga$ where X is between 0.3 and 0.7.

12. The apparatus of claim 1, wherein the first SAF layer includes a first sublattice having a first magnetic vector and a second sublattice having a second magnetic vector that is anti-parallel (AP) to the first magnetic vector.

13. The apparatus of claim 12, wherein the first magnetic vector is of equal strength to the second magnetic vector.

14. The apparatus of claim 1, wherein the first SAF layer and the fixed layer combine to provide a first magnetic vector and the second SAF layer provides a second magnetic vector that is anti-parallel (AP) to the first magnetic vector.

15. The apparatus of claim 1, wherein the first SAF layer includes a first amount of Ru, and the second SAF layer includes a second amount of Ru that is greater than the first amount of Ru.

16. That apparatus of claim 1, wherein the free layer includes a maximum width parallel to the plane in which the substrate lies and more than 50% of the maximum width includes magnetic fringing fields of less than 150 Oe collectively from the fixed layer and the first and second SAF layers.

17. A system comprising:
   a processor;
   a memory, coupled to the processor, including an apparatus according to claim 1; and
   a communication module, coupled to the processor, to communicate with a computing node external to the system.

18. The apparatus of claim 1 comprising a field programmable gate array (FPAG) including the MTJ.

19. An apparatus comprising:
   a substrate;
   a magnetic tunnel junction (MTJ), on the substrate, comprising a fixed layer, a free layer, and a dielectric layer between the fixed and free layers; and
   a first synthetic anti-ferromagnetic (SAF) layer, a second SAF layer, and an intermediate layer, which includes a non-magnetic metal, between the first and second SAF layers;
   wherein the first SAF layer includes a Heusler alloy;
   wherein the first SAF layer includes a first thickness, the second SAF layer includes a second thickness substantially equal to the first thickness, and thickness is measured orthogonally to a principle plane in which the substrate lies.

20. The apparatus of claim 19, wherein the Heusler alloy includes Manganese (Mn) and Ruthenium (Ru).

21. The apparatus of claim 20, wherein the non-magnetic metal includes Ru.

22. The apparatus of claim 21, wherein the first SAF layer is between the intermediate layer and the fixed layer.

23. The apparatus of claim 1, wherein:
the first SAF layer includes at least two ferromagnetic layers separated by a nonmagnetic layer;
the second SAF layer includes at least two ferromagnetic layers separated by a nonmagnetic layer.

24. The apparatus of claim 1, wherein:
the first SAF layer is not between the fixed and free layers;
the second SAF layer is not between the fixed and free layers.

25. The apparatus of claim 19, wherein the first SAF layer includes a first amount of Ru, and the second SAF layer includes a second amount of Ru that is greater than the first amount of Ru.

* * * * *